(12) United States Patent
Park et al.

(10) Patent No.: US 12,184,284 B2
(45) Date of Patent: Dec. 31, 2024

(54) FREQUENCY DIVIDER, ELECTRONIC DEVICE AND FREQUENCY DIVIDING METHOD

(71) Applicant: Beijing ESWIN Computing Technology Co., Ltd., Beijing (CN)

(72) Inventors: Dongsoo Park, Beijing (CN); Zuodong Wei, Beijing (CN)

(73) Assignee: Beijing ESWIN Computing Technology Co., Ltd., Beijing (CN)

( * ) Notice: Subject to any disclaimer, the term of this patent is extended or adjusted under 35 U.S.C. 154(b) by 1 day.

(21) Appl. No.: 18/160,448

(22) Filed: Jan. 27, 2023

(65) Prior Publication Data

US 2023/0246648 A1 Aug. 3, 2023

(30) Foreign Application Priority Data

Jan. 28, 2022 (CN) .......................... 202210106929.7

(51) Int. Cl.
*H03K 21/00* (2006.01)
*H03K 5/05* (2006.01)
*H03K 5/156* (2006.01)
*H03K 21/02* (2006.01)

(52) U.S. Cl.
CPC ............ *H03K 21/026* (2013.01); *H03K 5/05* (2013.01); *H03K 5/1565* (2013.01); *H03K 21/02* (2013.01)

(58) Field of Classification Search
CPC ........ H03K 21/06; H03K 5/05; H03K 5/1565; H03K 21/02
See application file for complete search history.

(56) References Cited

U.S. PATENT DOCUMENTS

| 7,227,920 B2 * | 6/2007 | Heikkila | ............... | H03K 5/159 |
| | | | | 375/373 |
| 7,652,517 B2 * | 1/2010 | Corcelli | ............... | H03K 5/135 |
| | | | | 327/295 |
| 9,270,280 B1 * | 2/2016 | Margarit | ............... | H03K 23/667 |

(Continued)

FOREIGN PATENT DOCUMENTS

CN 113315491 A 8/2021

OTHER PUBLICATIONS

Cicero S. Vaucher et al., "A Family of Low-Power Truly Modular Programmable Dividers in Standard 0.35-um CMOS Technology," IEEE JSSC, vol. 35, No. 7, Jul. 2000, pp. 1039-1045.

*Primary Examiner* — Tuan T Lam
(74) *Attorney, Agent, or Firm* — Leason Ellis LLP

(57) ABSTRACT

At least one embodiment of the present disclosure provides a frequency divider, an electronic device and a frequency dividing method. The frequency divider includes a duty cycle correction circuit and a frequency divider circuit. The duty cycle correction circuit is configured to receive a first clock signal, and perform a first processing on the first clock signal to generate a first processed signal. The frequency dividing circuit is configured to receive the first processed signal, and perform a second processing on the first processed signal to generate a second processed signal. The duty cycle correction circuit is further configured to receive the second processed signal, and perform a third processing on the second processed signal to generate a third processed signal. The frequency divider can correct the duty cycle of the output clock signal while dividing the frequency.

17 Claims, 6 Drawing Sheets

(56) References Cited

U.S. PATENT DOCUMENTS

| | | | | |
|---|---|---|---|---|
| 9,503,103 B2* | 11/2016 | Chou | ............... | H03L 7/1976 |
| 9,543,960 B1* | 1/2017 | He | ............... | H03K 21/10 |
| 10,348,316 B2* | 7/2019 | Matsuda | ............... | H03K 7/08 |
| 10,742,220 B1* | 8/2020 | Rao | ............... | H03K 21/38 |
| 10,931,289 B2* | 2/2021 | Satoh | ............... | H03L 7/0805 |
| 11,411,570 B1* | 8/2022 | Zhou | ............... | G06F 1/08 |
| 2003/0068003 A1* | 4/2003 | Casagrande | ............... | H03L 7/18 |
| | | | | 377/47 |
| 2009/0302900 A1* | 12/2009 | Marutani | ............... | H03L 7/081 |
| | | | | 327/254 |
| 2012/0071995 A1* | 3/2012 | Topchy | ............... | H04H 60/58 |
| | | | | 700/94 |
| 2018/0019753 A1* | 1/2018 | Jung | ............... | H03K 21/10 |

\* cited by examiner

2/3 frequency dividing subcircuit

FREQUENCY DIVIDER, ELECTRONIC DEVICE AND FREQUENCY DIVIDING METHOD

CROSS-REFERENCE TO RELATED APPLICATION

The present application claims priority of the Chinese Patent Application No. 202210106929.7, filed on Jan. 28, 2022, the disclosure of which is incorporated herein by reference in its entirety as part of the present application.

TECHNICAL FIELD

Embodiments of the present disclosure relate to a frequency divider, an electronic device and a frequency dividing method.

BACKGROUND

In a digital circuit system, a clock circuit (e.g., a phase-locked loop, a delay-locked loop, etc.) used for processing a clock signal is an important part. Most clock circuits use a frequency divider to divide the frequency to get a target frequency. Frequency dividers are widely distributed in digital equipment, which are used to divide the frequency of an input clock pulse signal and output a clock pulse signal with a frequency-divided clock frequency.

SUMMARY

At least one embodiment of the present disclosure provides a frequency divider, which includes a duty cycle correction circuit and a frequency divider circuit, the duty cycle correction circuit is configured to receive a first clock signal, and perform a first processing on the first clock signal to generate a first processed signal, in which a period of the first clock signal is a first period, a period of the first processed signal is a second period, and the second period is one P-th of the first period, where P is an integer greater than 1, the frequency dividing circuit is configured to receive the first processed signal, and perform a second processing on the first processed signal to generate a second processed signal, in which a period of the second processed signal is a third period, and the third period is Q times the second period, where Q is an integer greater than 1, and the duty cycle correction circuit is further configured to receive the second processed signal, and perform a third processing on the second processed signal to generate a third processed signal, in which a period of the third processed signal is a fourth period, and the fourth period is P times the third period.

For example, in the frequency divider provided in at least one embodiment of the present disclosure, the third processed signal is a clock signal with a duty cycle of 50%.

For example, in the frequency divider provided in at least one embodiment of the present disclosure, P=2.

For example, in the frequency divider provided in at least one embodiment of the present disclosure, the duty cycle correction circuit is connected to a first clock signal terminal to receive the first clock signal, and output the third processed signal.

For example, in the frequency divider provided in at least one embodiment of the present disclosure, the duty cycle correction circuit includes a frequency multiplying sub-circuit and a frequency dividing sub-circuit, For example, in the frequency divider provided in at least one embodiment of the present disclosure, the frequency multiplying sub-circuit is configured to perform the first processing on the first clock signal to obtain the first processed signal; and the frequency dividing sub-circuit is configured to perform the third processing on the second processed signal to obtain the third processed signal.

For example, in the frequency divider provided in at least one embodiment of the present disclosure, the frequency multiplying sub-circuit includes an XOR sub-circuit and a delay sub-circuit, the delay sub-circuit receives the first clock signal, and performs a delay processing on the first clock signal to obtain a first delay signal; and the XOR sub-circuit receives the first clock signal and the first delay signal, and performs an XOR operation on the first clock signal and the first delay signal to obtain the first processed signal.

For example, in the frequency divider provided in at least one embodiment of the present disclosure, the frequency dividing sub-circuit includes a trigger sub-circuit, a control terminal of the trigger sub-circuit is connected to the frequency dividing circuit to receive the second processed signal, and an output terminal of the trigger sub-circuit outputs the third processed signal.

For example, in the frequency divider provided in at least one embodiment of the present disclosure, the trigger sub-circuit is an edge-triggered D flip-flop, a clock terminal of the edge-triggered D flip-flop is used as the control terminal to receive the second processed signal, an input terminal D of the edge-triggered D flip-flop is connected to a second output terminal QB of the edge-triggered D flip-flop, and a first output terminal Q of the edge-triggered D flip-flop outputs the third processed signal.

For example, in the frequency divider provided in at least one embodiment of the present disclosure, the frequency dividing circuit is a multi-mode frequency divider.

At least one embodiment of the present disclosure further provides an electronic device, which includes the frequency divider provided by any embodiment of the present disclosure.

At least one embodiment of the present disclosure further provides a frequency dividing method, which includes: performing a first processing on a first clock signal to generate a first processed signal, in which a period of the first clock signal is a first period, a period of the first processed signal is a second period, and the second period is one P-th of the first period, where P is an integer greater than 1; performing a second processing on the first processed signal to generate a second processed signal, in which a period of the second processed signal is a third period, and the third period is Q times the second period, where Q is an integer greater than 1; and performing a third processing on the second processed signal to generate a third processed signal, in which a period of the third processed signal is a fourth period, and the fourth period is P times the third period.

For example, in the frequency dividing method provided in at least one embodiment of the present disclosure, the third processed signal is a clock signal with a duty cycle of 50%.

For example, in the frequency dividing method provided in at least one embodiment of the present disclosure, P=2.

For example, in the frequency dividing method provided in at least one embodiment of the present disclosure, performing the first processing on the first clock signal to generate the first processed signal includes: performing a delay processing on the first clock signal to obtain a first delay signal; and performing an XOR operation on the first clock signal and the first delay signal to obtain the first processed signal.

For example, in the frequency dividing method provided in at least one embodiment of the present disclosure, performing the third processing on the second processed signal to generate the third processed signal includes: performing the third processing by using an edge-triggered D flip-flop to generate the third processed signal.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1A:
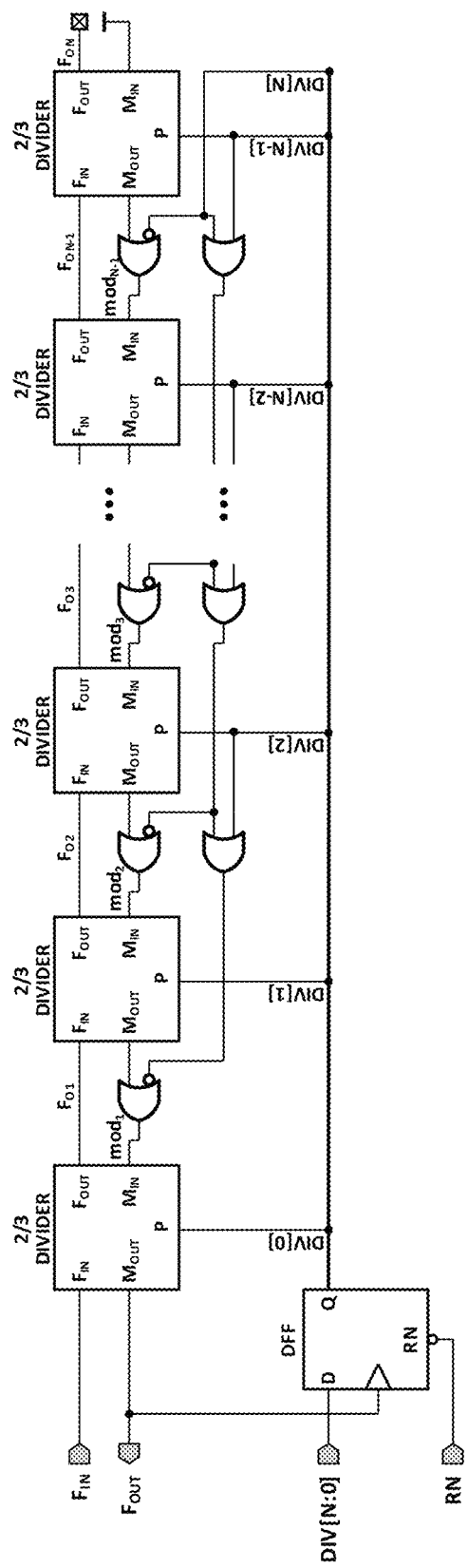
FIG. 1A is a circuit structure diagram of a frequency divider.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below through several specific embodiments. To keep the following description of the embodiments of the present disclosure clear and concise, detailed descriptions of well-known functions and well-known components may be omitted. When any component of an embodiment of the present disclosure appears in more than one drawing, the component is denoted by the same reference numeral in each drawing.

In some digital circuit systems, a frequency of the clock signal can be adjusted by changing a frequency dividing ratio of a frequency divider in a clock circuit. However, it is difficult for a signal output by the frequency divider to reach a duty cycle of 50%. In the digital circuit systems, a clock signal with a duty cycle of 50% can better ensure that various operations do not cause timing problems. Especially in a double edge trigger system, the duty cycle is a very important issue. For example, in a Double Data Rate (DDR) system, the clock pulse signal needs to ensure a certain pulse width during the working process.

Figure 1B:
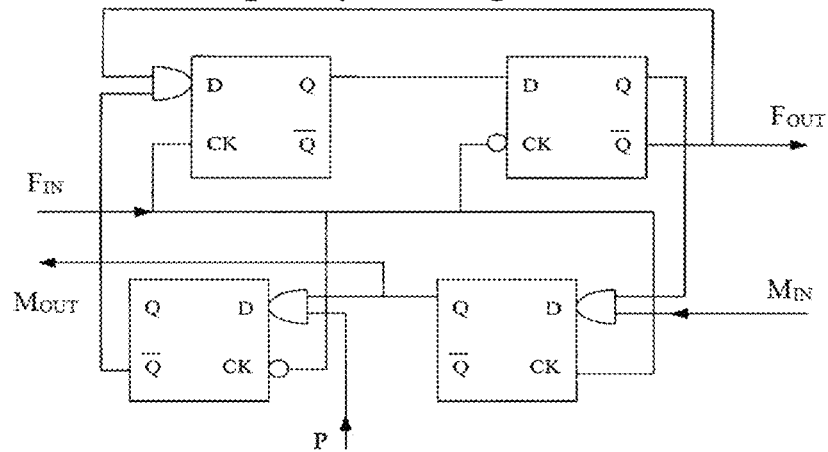
FIG. 1B is a schematic structural diagram of a ⅔ frequency dividing sub-circuit in the frequency divider shown in FIG. 1A.

FIG. 1 shows a circuit structure of a frequency divider; as shown in FIG. 1, the frequency divider is a multi-mode frequency divider, including N divide-by-2/divide-by-3 (⅔) frequency dividing sub-circuits (⅔ dividers), a D flip-flop (DFF), and several OR/NOT logical operation circuits, where N is an integer greater than 1. FIG. 1B is a schematic structural diagram of a ⅔ frequency dividing sub-circuit in the frequency divider shown in FIG. 1A.

In FIG. 1A and FIG. 1B, each ⅔ frequency dividing sub-circuit has a clock signal input terminal $F_{IN}$, a clock signal output terminal $F_{OUT}$, a modulation signal input terminal $M_{IN}$, and a modulation signal output terminal $M_{OUT}$. An input signal $F_{IN}$ passes through a first (0-th stage) ⅔ frequency dividing sub-circuit to output a signal $F_{O1}$, the signal $F_{O1}$ then passes through a second (1st stage) ⅔ frequency dividing sub-circuit to output a signal $F_{O2}$, . . . , it goes on stage by stage until a signal $F_{ON}$ is output. The output signals $F_{O1}$, $F_{O2}$, . . . , $F_{ON-1}$, $F_{ON}$ are the results output by the ⅔ frequency dividing sub-circuits of all stages, and are used to generate and output modulation signals of the ⅔ frequency dividing sub-circuits of all stages according to modulation signals received (input) by the ⅔ frequency dividing sub-circuits of all stages, and the output modulation signals are subjected to logical operations corresponding to all bits of a control word DIV[N:0] to generate modulation signals $mod_1$, $mod_2$, . . . $mod_{N-1}$ used for a previous stage. A modulation signal input terminal $M_{IN}$ of an N-th ⅔ frequency dividing sub-circuit receives an input modulation signal (such as a voltage signal VDD) from external, and the output clock signal $F_{OUT}$ of the frequency divider is generated based on the input signal $F_{IN}$ and these cascaded modulation signals $mod_1, mod_2, \ldots mod_{N-1}$.

The control word DIV[N:0] is used to determine a dividing ratio of the frequency divider. The control word DIV[N:0] is input to an input terminal D of the D flip-flop, and the output signal $F_{OUT}$ of the frequency divider is input to a clock control terminal of the D flip-flop as a clock signal; through triggering of the output signal $F_{OUT}$, each bit of the control word DIV[N:0] is input to the frequency dividing sub-circuit of each stage through (an output terminal Q of) the D flip-flop. Specifically, DIV[0] is input to a control terminal (programming input terminal) P of the 0-th stage ⅔ frequency dividing sub-circuit, DIV[1] is input to a control terminal P of the 1st stage ⅔ frequency dividing sub-circuit, ..., DIV[N−1] is input to a control terminal P of the (N−1)-th stage ⅔ frequency dividing sub-circuit, and DIV[N] performs "OR" operation with a modulation signal output by a modulation signal output terminal $M_{OUT}$ of the (N−1)-th stage ⅔ frequency dividing sub-circuit after performing a "NOT" operation, and a modulation signal $mod_{N-1}$ input to the modulation signal input terminal $M_{IN}$ of the (N−2)-th stage ⅔ frequency dividing sub-circuit is obtained by this operation; DIV[N] performs an "OR" operation with DIV [N−1] and then performs a "NOT" operation, and then a result of the "NOT" operation is used to perform an "OR" operation with a modulation signal output by the modulation signal output terminal $M_{OUT}$ of the (N−2)-th stage ⅔ frequency dividing sub-circuit, and a modulation signal $mod_{N-2}$ input to a modulation signal input terminal $M_{IN}$ of an (N−3)-th stage ⅔ frequency dividing sub-circuit is obtained by this operation; and other stages are processed according to this rule. In addition, a reset terminal RN of the D flip-flop receives a corresponding reset signal RN. When an input signal of the control terminal P and an input signal of the modulation signal input terminal $M_{IN}$ are both at high level, the ⅔ frequency dividing sub-circuit works in the 3-frequency division mode, and the ⅔ frequency dividing sub-circuit works in the 2-frequency division mode in other cases.

Another programmable multi-mode frequency divider based on the ⅔ frequency dividing sub-circuit can be found, for example, in Cicero S. Vaucher et al., "A Family of Low-Power Truly Modular Programmable Dividers in Standard 0.35-um CMOS Technology," IEEE JSSC, vol. 35, No. 7, Jul. 2000, pp. 1039-1045.

Figure 2:
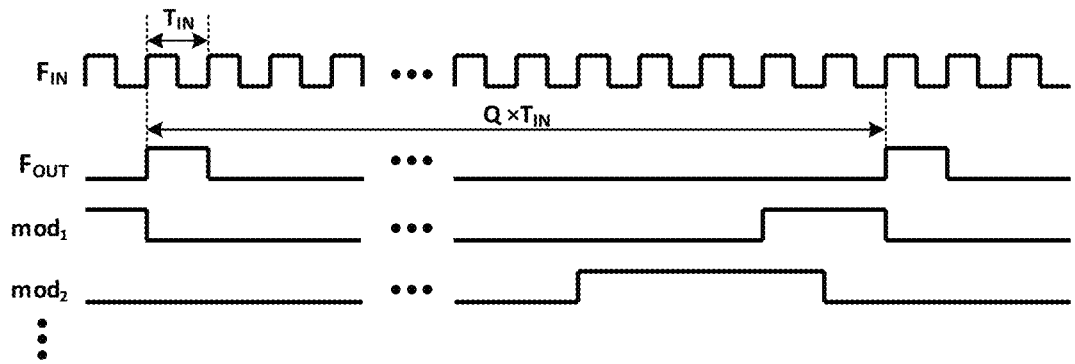
FIG. 2 is a timing diagram of a clock pulse signal when the frequency divider in FIG. 1A performs Q-frequency division.

As mentioned above, under control of the input control word DIV[N:0], the frequency divider can support various frequency dividing ratios. For example, FIG. 2 is a timing diagram of a clock pulse signal when the frequency divider in FIG. 1A performs Q-frequency division. When a period of the input signal $F_{IN}$ is $T_N$, the frequency divider outputs an output signal $F_{OUT}$ which is the Q-frequency division of the input signal $F_{IN}$, that is, a period of the output signal $F_{OUT}$ is Q times $T_N$. However, the output signal of the frequency divider cannot guarantee a duty cycle of 50%.

At least one embodiment of the present disclosure provides a frequency divider. The frequency divider includes a duty cycle connection circuit and a frequency dividing circuit. The duty cycle correction circuit is configured to receive a first clock signal, and perform a first processing on the first clock signal to generate a first processed signal. A period of the first clock signal is a first period, a period of the first processed signal is a second period, and the second period is one P-th of the first period, where P is an integer greater than 1. The frequency dividing circuit is configured to receive the first processed signal, and perform a second processing on the first processed signal to generate a second processed signal. A period of the second processed signal is a third period, and the third period is Q times the second period, where Q is an integer greater than 1. The duty cycle correction circuit is further configured to receive the second processed signal, and perform a third processing on the second processed signal to generate a third processed signal. A period of the third processed signal is a fourth period, and the fourth period is P times the third period.

In at least one example, the frequency divider is provided with a duty cycle correction circuit based on the frequency dividing circuit, for example, while supporting multiple frequency dividing ratios, the frequency divider can also correct the duty cycle of the output signal, for example, make the duty cycle of the output signal be 50%. For example, the frequency divider can be applied to a DDR digital system in which the rising edge and falling edge are required to sample simultaneously, so that various clock circuits can output clock signals with a duty cycle of 50%.

The frequency divider in the embodiments of the present disclosure has no limitation on the type, structure, and the like of the frequency dividing circuit included, as long as it can implement frequency division of the clock signal. For example, the frequency dividing circuit may be an even-frequency dividing circuit or an odd-frequency dividing circuit, and may be constructed based on a flip-flop or based on a counter.

At least one embodiment of the present disclosure further provides an electronic device corresponding to the above-mentioned frequency divider, for example, the electronic device is a DDR digital system.

At least one embodiment of the present disclosure further provides a frequency dividing method corresponding to the above-mentioned frequency divider.

The embodiments of the present disclosure will be described in detail below with reference to the accompanying drawings, but the present disclosure is not limited to these specific embodiments.

Figure 3:
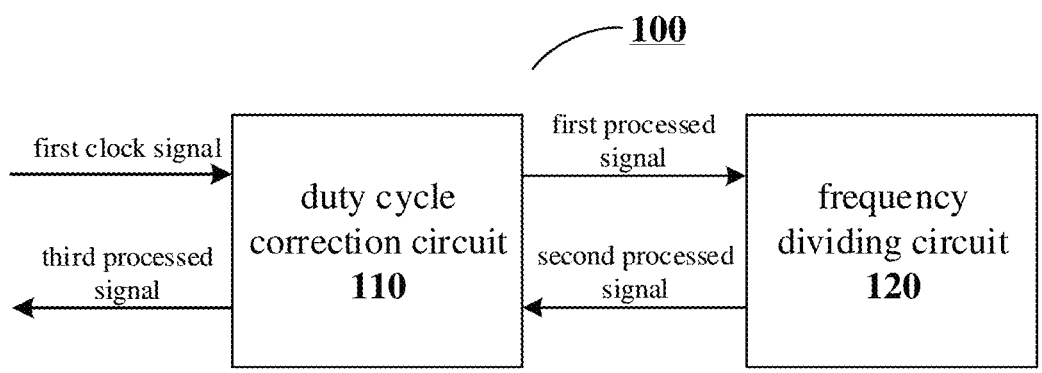
FIG. 3 is a schematic diagram of a frequency divider provided by at least one embodiment of the present disclosure.

FIG. 3 is a schematic diagram of a frequency divider 100 provided by at least one embodiment of the present disclosure.

For example, as shown in FIG. 3, the frequency divider 100 includes a duty cycle correction circuit 110 and a frequency dividing circuit 120. The duty cycle correction circuit 110 is configured to receive a first clock signal as an input signal, and perform a first processing on the first clock signal to generate a first processed signal. A period of the first clock signal is a first period, a period of the first processed signal is a second period, and the second period is one P-th of the first period, where P is an integer greater than 1. The frequency dividing circuit 120 is configured to receive the first processed signal, and perform a second processing on the first processed signal to generate a second processed signal. A period of the second processed signal is a third period, and the third period is Q times the second period, where Q is an integer greater than 1. The duty cycle correction circuit 110 is further configured to receive the second processed signal, and perform a third processing on the second processed signal to generate a third processed signal. A period of the third processed signal is a fourth period, and the fourth period is P times the third period.

Figure 4:
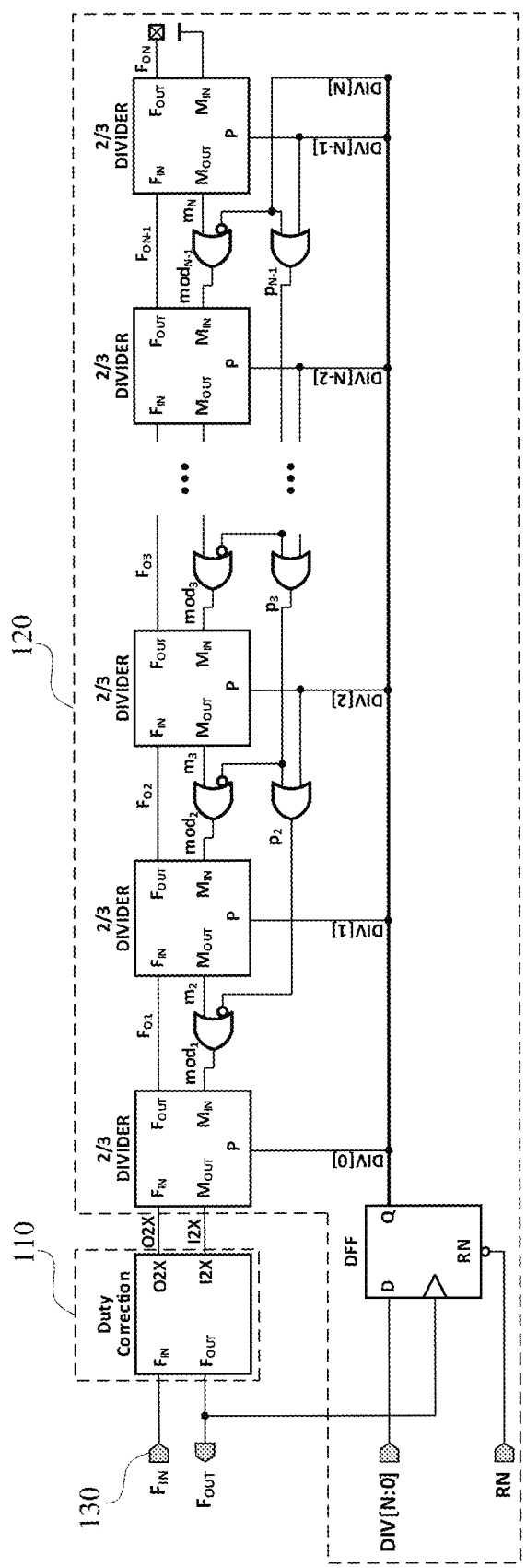
FIG. 4 is a circuit structure diagram of a specific implementation example of the frequency divider shown in FIG. 3.

FIG. 4 is circuit structure diagram of a specific implementation example of the frequency divider 100 shown in FIG. 3.

For example, as shown in FIG. 4, the duty cycle correction circuit 110 is connected to a first clock signal terminal 130 to receive a first clock signal $F_{IN}$. The duty cycle correction circuit 110 performs the first processing on the first clock signal $F_{IN}$ to generate a first processed signal O2X, and inputs the first processed signal O2X to the frequency dividing circuit 120.

For example, the first processing may be to perform a P-frequency multiplication processing on the first clock signal $F_{IN}$. A period of the first clock signal $F_{IN}$ is a first period $T_1$, and a period of the first processed signal O2X is a second period $T_2$; the second period $T_2$ is one P-th of the first period $T_1$.

For example, the frequency dividing circuit 120 performs the second processing on the first processed signal O2X to generate a second processed signal I2X, and inputs the second processed signal I2X to the duty cycle correction circuit 110.

For example, the second processing may be to perform a Q-frequency division processing on the first processed signal O2X. A period of the second processed signal I2X is a third period $T_3$, and the third period $T_3$ is Q times the second period $T_2$.

For example, the duty cycle correction circuit 110 performs the third processing on the second processed signal I2X to generate a third processed signal $F_{OUT}$, and outputs the third processed signal $F_{OUT}$.

For example, the third processing may be to perform a P-frequency division processing on the second processed signal I2X. A period of the third processed signal is a fourth period $T_4$, and the fourth period $T_4$ is P times the third period $T_3$.

For example, after the above processing, the third processed signal $F_{OUT}$ is a Q-frequency divided signal which is the Q-frequency division of the first clock signal $F_{IN}$, that is, the frequency divider performs the Q-frequency division processing, and the frequency dividing ratio is determined by parameters of the frequency dividing circuit 120.

For example, the frequency dividing ratio of the frequency dividing circuit 120 may be fixed or may be variable (programmable). For example, in some examples with variable frequency dividing ratios, the frequency dividing circuit 120 may be a multi-mode frequency divider, for example, the multi-mode frequency divider has substantially the same circuit structure as the frequency divider shown in FIG. 1A. For example, as shown in FIG. 4, the frequency dividing circuit 120 may include N ⅔ frequency dividing sub-circuits, a D flip-flop (DFF), and several OR/NOT logic operation circuits, where N is an integer greater than 1.

The control word DIV [N:0] is input to the input terminal D of the D flip-flop, and the third processed signal $F_{OUT}$ output by the duty cycle correction circuit is input to the clock control terminal of the D flip-flop (which is different from the case shown in FIG. 1A), and the output terminal Q of the D flip-flop outputs N+1 control words DIV[N:0] in turn according to the triggering of the third processed signal $F_{OUT}$, in which the control word DIV[0] is input to the control terminal P to of the first (the 0-th stage) ⅔ frequency dividing sub-circuit, DIV[1] is input to the control terminal P of the second (the 1st stage) ⅔ frequency dividing sub-circuit, . . . , DIV[N−1] is input to the control terminal P of the N-th (the (N−1)-th stage) ⅔ frequency dividing sub-circuit.

For example, as the case described in FIG. 1A, a generation procedure of the modulation signals $mod_1$, $mod_2$, . . . , $mod_{N-1}$ of all stages are as follows. A modulation signal $m_N$ output by the N-th ⅔ frequency dividing sub-circuit is performed an "OR" operation with a negation of the control word DIV[N], to obtain a modulation signal $mod_{N-1}$, and the modulation signal is input to the (N−1)-th ⅔ frequency dividing sub-circuit; a modulation signal $m_{N-1}$ output by the (N−1)-th ⅔ frequency dividing sub-circuit is performed an "OR" operation with a negation of $p_{N-1}$ ($p_{N-1}$ is an AND operation result of DIV[N−1] and DIV[N]), to obtain a modulation signal $mod_{N-2}$, and the modulation signal is input to the (N−2)-th ⅔ frequency dividing sub-circuit; . . . ; a modulation signal $m_i$ output by the i-th ⅔ frequency dividing sub-circuit is performed an "OR" operation with a negation of $p_i$ ($p_i$ is an OR operation result of DIV[i] and $p_{i+1}$), to obtain a modulation signal $mod_{i-1}$, and the modulation signal is input to the (i−1)-th ⅔ frequency dividing sub-circuit; . . . ; a modulation signal $m_2$ output by the second ⅔ frequency dividing sub-circuit is performed an "OR" operation with a negation of $p_2$ ($p_2$ is an OR operation result of DIV[2] and $p_3$), to obtain a modulation signal $mod_1$, and the modulation signal is input to the first ⅔ frequency dividing sub-circuit. Here, i=2, 3, . . . , N−2.

For example, a second processing procedure of the frequency dividing circuit 120 (i.e., the operation procedure of the N cascaded ⅔ frequency dividing sub-circuits) is as follows. The first processed signal O2X and the modulation signal $mod_1$ are input into the first ⅔ frequency dividing sub-circuit, to output the signal $F_{O1}$ and the second processed signal I2X after operation; the signal $F_{O1}$ and the modulation signal $mod_2$ are input into the second ⅔ frequency dividing sub-circuit, to output the signal $F_{O2}$ and the modulation signal $m_2$ after operation; . . . ; the signal $F_{Oi-1}$ and the modulation signal $mod_i$ are input to the i-th ⅔ frequency dividing sub-circuit, to output the signal $F_{Oi}$ and the modulation signal $m_1$ after operation; . . . ; the signal $F_{ON-1}$ and "0" are input to the N-th ⅔ frequency dividing sub-circuit, to output the signal $F_{ON}$ and the modulation signal $m_N$ after operation. Here, i=2, 3, . . . , N−1.

For example, for each ⅔ frequency dividing sub-circuit, taking the i-th ⅔ frequency dividing sub-circuit as an example, when the modulation signal $mod_i$=0, the signal $F_{oi}$ is an output of 2-frequency division of the signal $F_{oi-1}$, and the modulation signal $m_i$ is constant as 0; when the modulation signal $mod_i$=1, if DIV[i−1]=0, the signal $F_{oi}$ is the output of 2-frequency division of the signal $F_{oi-1}$, and the modulation signal $m_1$ is also the output of 2-frequency division of the signal $F_{oi-1}$; when the modulation signal $mod_i$=1, if DIV[i−1]=1, the signal $F_{oi}$ is the output of 3-frequency division of the signal $F_{oi-1}$, and the modulation signal $m_i$ is also the output of 3-frequency division of the signal $F_{oi-1}$. Here, i=1, 2, . . . , N. Therefore, the selection of the frequency dividing ratio can be achieved through the control word DIV[N:0].

For example, according to the above-mentioned second processing procedure, after the first processed signal O2X is input to the frequency dividing circuit 120, the second processed signal I2X, which is Q-frequency divided, is generated.

Figure 5:
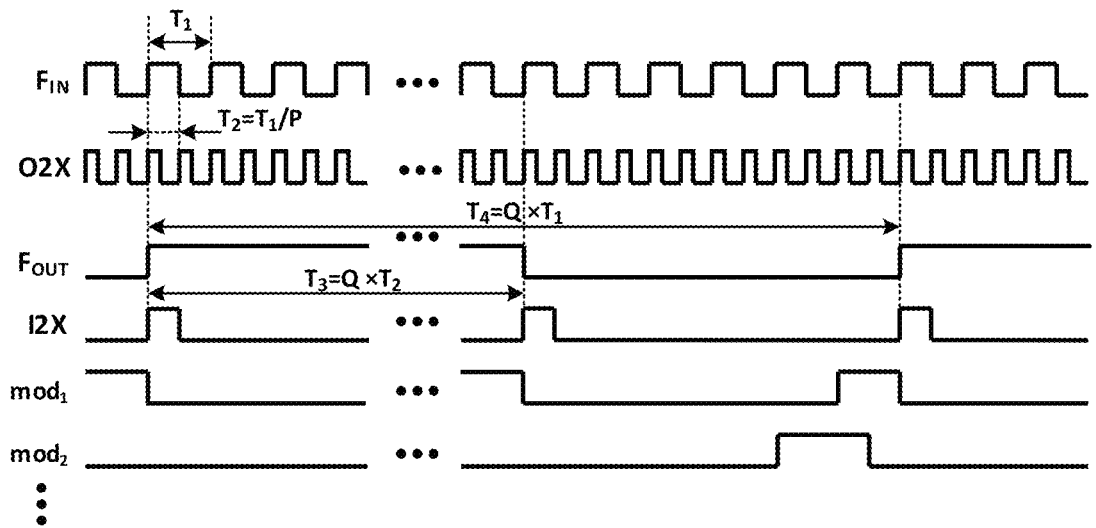
FIG. 5 is a timing diagram of a clock pulse signal when a frequency divider performs Q-frequency division according to at least one embodiment of the present disclosure.

FIG. 5 is a timing diagram of a clock pulse signal when a frequency divider performs Q-frequency division according to at least one embodiment of the present disclosure.

For example, in some examples, FIG. 5 is a timing diagram of a clock pulse signal when the frequency divider in FIG. 4 performs Q-frequency division. As shown in FIG. 5, a period of the first clock signal $F_{IN}$ is a first period $T_1$; and a period of the first processed signal O2X is a second period $T_2$. The duty cycle correction circuit 110 performs the first processing on the first clock signal $F_{IN}$ to generate the first processed signal O2X, and the first processing is to perform the P-frequency multiplication processing on the first clock signal $F_{IN}$, therefore $$T_2 = T_1/P \qquad \text{Equation (1)}$$

For example, a period of the second processed signal I2X is a third period $T_3$. The frequency dividing circuit 120 performs the second processing on the first processed signal O2X to generate the second processed signal I2X, and the second processing is to perform the Q-frequency division processing on the first processed signal O2X, therefore $$T_3 = Q \times T_2 \qquad \text{Equation (2)}$$

For example, a period of the third processed signal is a fourth period $T_4$. The duty cycle correction circuit 110 performs the third processing on the second processed signal I2X to generate the third processed signal $F_{OUT}$, and the third processing is to perform the P-frequency division processing on the second processed signal I2X, therefore $$T_4 = P \times T_3 \qquad \text{Equation (3)}$$

For example, according to equations (1)-(3), a relationship between the fourth period $T_4$ and the first period $T_1$ can be obtained as $$T_4 = Q \times T_1 \qquad \text{Equation (4)}$$

For example, according to Equation (4), it can be known that the third processed signal $F_{OUT}$ is a Q frequency-divided signal which is the Q-frequency division of the first clock signal $F_{IN}$; and since the P-frequency division processing is performed on the signal at a previous stage (i.e., the second processed signal I2X) in the third processing, for example, the duty cycle of the third processed signal $F_{OUT}$ may be adjusted with respect to the second processed signal I2X through the third processing, for example, the duty cycle of the third processed signal $F_{OUT}$ may be 1/P, for example, the third processed signal is a clock signal with a duty cycle of 50%.

For example, as shown in FIG. 5, the third processed signal $F_{OUT}$ is a Q frequency-divided signal which is the Q-frequency division of the first clock signal $F_{IN}$. In a specific example of FIG. 5, P=2, so in the duty cycle correction circuit, the signal to be input to the frequency dividing circuit is first subjected to a frequency doubling processing, and the signal output from the frequency dividing circuit is then subjected to a 2-frequency division processing. Also at this time, for example, the third processed signal is a clock signal with a duty cycle of 50%.

Figure 6:
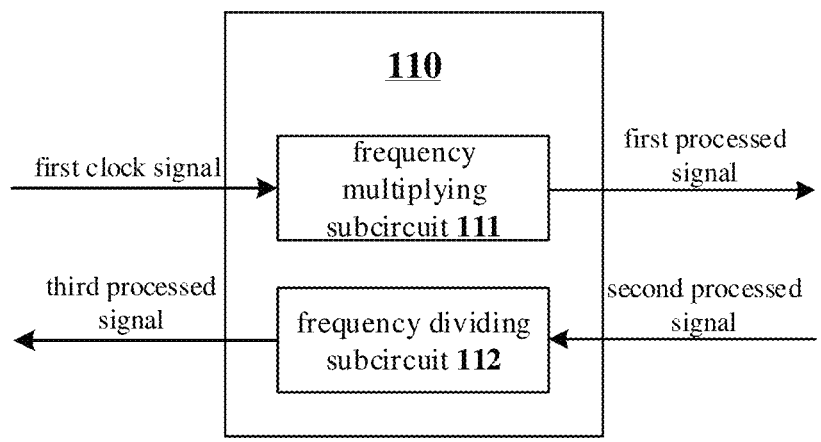
FIG. 6 is a schematic diagram of a duty cycle correction circuit provided by at least one embodiment of the present disclosure.

FIG. 6 is a schematic diagram of a duty cycle correction circuit provided by at least one embodiment of the present disclosure.

For example, as shown in FIG. 6, the duty cycle correction circuit 110 includes a frequency multiplying sub-circuit 111 and a frequency dividing sub-circuit 112. The frequency multiplying sub-circuit 111 is configured to perform the first processing on the first clock signal $F_{IN}$ to obtain the first processed signal O2X; the frequency dividing sub-circuit 112 is configured to perform the third processing on the second processed signal I2X to obtain the third processed signal $F_{OUT}$. For the specific procedures of the first processing, the second processing, and the third processing, reference may be made to the relevant descriptions in the above mentioned embodiments, and details are not repeated here. For example, the third processing may also to output a clock signal with a 50% duty cycle.

Figure 7A:
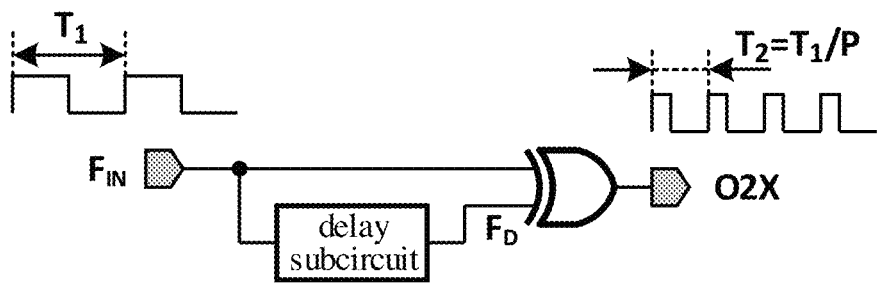
FIG. 7A is a schematic diagram of a frequency multiplying sub-circuit provided by at least one embodiment of the present disclosure.

FIG. 7A is a schematic diagram of an exemplary circuit structure of the frequency multiplying sub-circuit 111 in FIG. 6.

For example, as shown in FIG. 7A, the frequency multiplying sub-circuit 111 includes an XOR sub-circuit and a delay sub-circuit. The delay sub-circuit receives the first clock signal $F_{IN}$, and performs a delay processing on the first clock signal $F_{IN}$ to obtain the first delay signal $F_D$; the XOR sub-circuit receives the first clock signal $F_{IN}$ and the first delay signal $F_D$, and performs an XOR operation on the first clock signal $F_{IN}$ and the first delay signal $F_D$ to obtain the first processed signal O2X.

For example, the above-mentioned operation procedure of the delay sub-circuit and the XOR sub-circuit is an example of the first processing. By performing the delay processing on the first clock signal $F_{IN}$, and by performing an XOR operation on the first clock signal $F_{IN}$ and the first delayed signal $F_D$, a first processed signal O2X which is P-frequency multiplication of the first clock signal $F_{IN}$ is obtained. In an example of FIG. 7A, P=2, that is, the frequency multiplying sub-circuit 111 performs the frequency doubling processing on the first clock signal $F_{IN}$, and a length of the delay period implemented by the delay sub-circuit can adjust the duty cycle of the first processed signal O2X; for example, when the first clock signal $F_{IN}$ is a clock signal with a duty cycle of 50%, and the delay period implemented by the delay sub-circuit is equal to half the period of the first clock signal $F_{IN}$, then the obtained first processed signal O2X also has a duty cycle of 50%; for example, when the first clock signal $F_{IN}$ is a clock signal with a duty cycle of 50%, and the delay period implemented by the delay sub-circuit is equal to ¼ of the period of the first clock signal $F_{IN}$, the duty cycle of the obtained first processed signal O2X is 25%.

For example, the delay sub-circuit may be an electronic element (e.g., a latch, etc.) capable of implementing the delay processing, and the XOR sub-circuit may be an electronic element capable of implementing an XOR logical operation, which is not limited in the embodiments of the present disclosure.

Figure 7B:
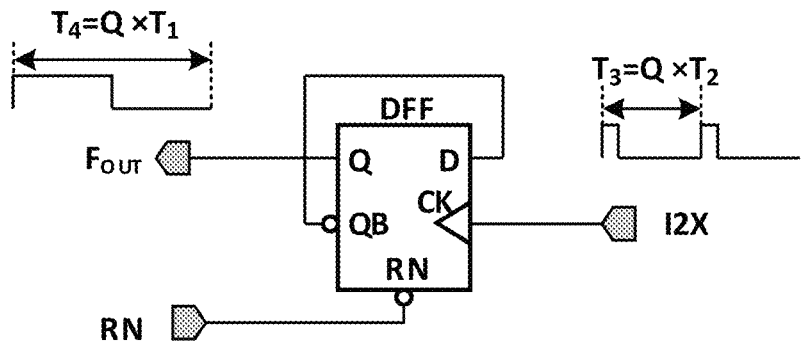
FIG. 7B is a schematic diagram of a frequency dividing sub-circuit provided by at least one embodiment of the present disclosure.

FIG. 7B is a schematic diagram of an exemplary circuit structure of the frequency dividing sub-circuit 112 in FIG. 6.

For example, as shown in FIG. 7B, the frequency dividing sub-circuit 112 includes a trigger sub-circuit. A control terminal of the trigger sub-circuit is connected to the frequency dividing circuit 120 to receive the second processed signal I2X, and an output terminal of the trigger sub-circuit outputs the third processed signal $F_{OUT}$.

For example, in the example of FIG. 7B, the trigger sub-circuit may be an edge-triggered D flip-flop (DFF). A clock terminal CK of the DFF serves as a control terminal to receive the second processed signal I2X, an input terminal D of the DFF is connected to a second output terminal QB of the DFF, and a first output terminal Q of the DFF outputs the third processed signal $F_{OUT}$. The DFF is configured to perform the P-frequency division processing on the second processed signal I2X. A reset terminal RN of the DFF receives a reset signal RN. For a specific introduction of the DFF, reference may be made to the description in the art, and details are not repeated here.

For example, the processing of the second processed signal I2X by the DFF is an example of the third processing. The DFF performs the frequency division processing on the second processed signal I2X to obtain the third processed signal $F_{OUT}$ which is P-frequency division of the second processed signal I2X. In the example of FIG. 7B, P=2, that is, the DFF performs a 2-frequency division processing on the first processed signal O2X, which makes the duty cycle of the third processed signal $F_{OUT}$ equal to 50%.

For example, the trigger sub-circuit may also be replaced with other electronic elements capable of implementing the frequency division processing, which is not limited in the embodiments of the present disclosure.

For example, when the duty cycle correction circuit 110 includes the frequency multiplying sub-circuit 111 as shown in FIG. 7A and the frequency dividing sub-circuit 112 as shown in FIG. 7B, the frequency multiplying sub-circuit 111 receives the first clock signal $F_{IN}$ with a period of $T_1$, and performs the frequency doubling processing on the first clock signal $F_{IN}$ to obtain a first processed signal O2X with a period of $T_2$, that is, $T_2=T_1/2$; the frequency dividing sub-circuit 112 receives the second processed signal I2X processed by the frequency dividing circuit 120 with a period of $T_3$, and performs the 2-frequency division processing on the second processed signal I2X to obtain a third processed signal $F_{OUT}$ with a period of $T_4$, that is, $T_4=2\times T_3$. According to equations (1) to (4), the third processed signal $F_{OUT}$ is a Q frequency-divided signal which is the Q-frequency division of the first clock signal $F_{IN}$, and the duty cycle of the obtained third processed signal $F_{OUT}$ is 50%.

Figure 8:
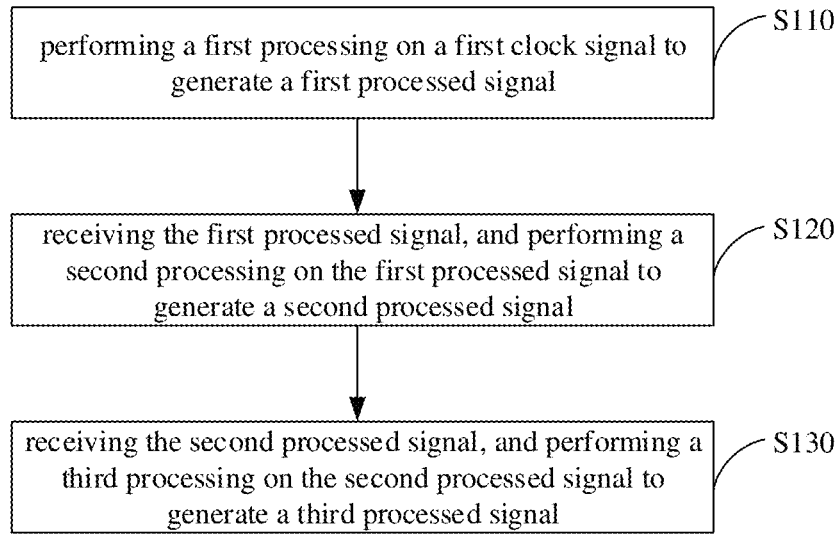
FIG. 8 is a flowchart of a frequency dividing method provided by at least one embodiment of the present disclosure.

FIG. 8 is a flowchart of a frequency dividing method provided by at least one embodiment of the present disclosure. For example, as shown in FIG. 8, the frequency dividing method of the frequency divider 100 includes steps S110 to S130.

Step S110: performing a first processing on a first clock signal to generate a first processed signal, in which a period of the first clock signal is a first period, a period of the first processed signal is a second period, and the second period is one P-th of the first period, where P is an integer greater than 1;

Step S120: receiving the first processed signal, and performing a second processing on the first processed signal to generate a second processed signal, in which a period of the second processed signal is a third period, and the third period is Q times the second period, where Q is an integer greater than 1; and Step S130: receiving the second processed signal, and performing a third processing on the second processed signal to generate a third processed signal, in which a period of the third processed signal is a fourth period, and the fourth period is P times the third period.

For step S110, for example, a first clock signal $F_{IN}$ may be received by the duty cycle correction circuit 110, and the duty cycle correction circuit 110 performs the first processing on the first clock signal $F_{IN}$ to generate a first processed signal O2X, and input the processed signal O2X to the frequency dividing circuit 120. The first processing may be to perform a P-frequency multiplication processing on the first clock signal $F_{IN}$, that is, the second period $T_2$ (the period of the first processed signal O2X) is one P-th of the first period $T_1$ (the period of the first clock signal $F_{IN}$).

For step S120, for example, the frequency dividing circuit 120 can receive the first processed signal O2X, the frequency dividing circuit 120 performs the second processing on the first processed signal O2X to generate a second processed signal I2X, and inputs the second processed signal I2X into the duty cycle correction circuit 110. The second processing may be to perform a Q-frequency division processing on the first processed signal O2X, that is, the third period $T_3$ (the period of the second processed signal I2X) is Q times the second period $T_2$ (the period of the first processed signal O2X).

For step S130, for example, the second processed signal I2X may be received by the duty cycle correction circuit 110, the duty cycle correction circuit 110 performs the third processing on the second processed signal I2X to generate a third processed signal $F_{OUT}$, and outputs the third processed signal $F_{OUT}$. The third processing may be to perform a P-frequency division processing on the second processed signal I2X, that is, the fourth period $T_4$ (the period of the third processed signal $F_{OUT}$) is P times the third period $T_3$ (the period of the second processed signal I2X).

For example, after the above steps S110 to S130, the third processed signal $F_{OUT}$ is a Q frequency-divided signal which is the Q-frequency division of the first clock signal $F_{IN}$. And, for example, the third processing is further to adjust the duty cycle of the third processed signal $F_{OUT}$, for example, the duty cycle of the third processed signal $F_{OUT}$ may be made to be 1/P. In some examples, P=2, and the duty cycle of the third processed signal may be made to be a clock signal with a duty cycle of 50%. For a specific introduction, reference may be made to the relevant description of the frequency divider 100 in the above mentioned embodiments, which is not repeated here.

Figure 9:
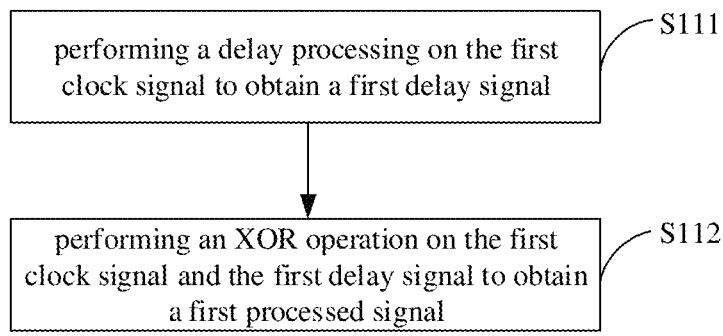
FIG. 9 is a flowchart of a first processing method provided by at least one embodiment of the present disclosure.

FIG. 9 is a flowchart of a first processing method provided by at least one embodiment of the present disclosure.

For example, the step S110, in which the first processing is performed on the first clock signal to generate the first processed signal, includes steps S111 and S112.

Step S111: performing a delay processing on the first clock signal to obtain a first delay signal; and Step S112: performing an XOR operation on the first clock signal and the first delay signal to obtain a first processed signal.

For example, the duty cycle correction circuit 110 includes a frequency multiplying sub-circuit 111 and a frequency dividing sub-circuit 112, and the frequency multiplying sub-circuit 111 includes an XOR sub-circuit and a delay sub-circuit. For example, for step S111, the delay sub-circuit receives the first clock signal $F_{IN}$, and performs the delay processing on the first clock signal $F_{IN}$ to obtain a first delay signal $F_D$. For step S112, the XOR sub-circuit receives the first clock signal $F_{IN}$ and the first delay signal $F_D$, and performs an XOR operation on the first clock signal $F_{IN}$ and the first delay signal $F_D$ to obtain the first processed signal O2X.

For example, after the above steps S111 to S112, the first processed signal O2X which is P-frequency multiplication of the first clock signal $F_{IN}$ is obtained. In some examples, P=2, that is, the frequency multiplying sub-circuit 111 performs the frequency doubling processing on the first clock signal $F_{IN}$. For a specific introduction, reference may be made to the related description of the frequency multiplying sub-circuit 111 in the above mentioned embodiments, and details are not repeated here.

For example, in step S130, performing the third processing on the second processed signal to generate the third processed signal includes performing the third processing using an edge-triggered D flip-flop to generate the third processed signal.

For example, the frequency dividing sub-circuit 112 includes a trigger sub-circuit, and the trigger sub-circuit may be an edge-triggered D flip-flop (DFF). The DFF performs the frequency division processing on the second processed signal I2X to obtain the third processed signal $F_{OUT}$ which is P-frequency division of the second processed signal I2X. In some examples, P=2, that is, the DFF performs a 2-frequency division processing on the first processed signal O2X. For a specific introduction, reference may be made to the relevant description of the frequency dividing sub-circuit 112 in the above mentioned embodiments, and details are not repeated here.

Figure 10:
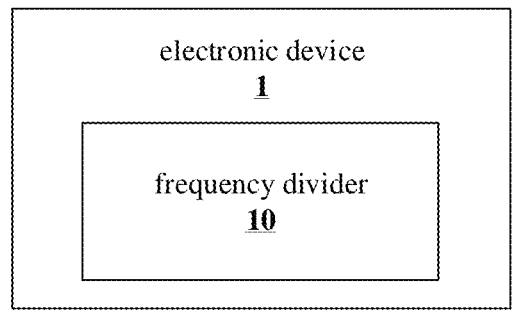
FIG. 10 is a schematic diagram of an electronic device according to at least one embodiment of the present disclosure.

FIG. 10 is a schematic diagram of an electronic device according to at least one embodiment of the present disclosure.

For example, as shown in FIG. 10, the electronic device 1 includes a frequency divider 10, for example, the frequency divider 10 is the frequency divider provided in any embodiment of the present disclosure.

For example, the electronic device 1 may be a DDR digital system, or may be any device such as a mobile phone, a tablet computer, a laptop, an e-book, a game console, a television, a digital photo frame, a navigator, etc., or may be any combination of an electronic devices and hardware, which is not limited by the embodiments of the present disclosure.

It should be noted that, for the sake of clarity and conciseness, the embodiments of the present disclosure do not provide all the constituent sub-circuits of the electronic device 1. In order to implement the necessary functions of the electronic device, those skilled in the art can provide or set other unshown constituent sub-circuits according to specific needs, which are not limited by the embodiments of the present disclosure.

For the relevant description and technical effects of the electronic device 1, reference may be made to the relevant description and technical effects of the frequency divider provided in the embodiments of the present disclosure, and details are not repeated here.

The technical effects of the in-memory computing processing apparatus provided by the embodiments of the present disclosure may be referred to the corresponding descriptions of the parallel acceleration method and the in-memory computing processor in the above embodiments, which will not be repeated here.

The following points need to be noted:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure may be combined.

The above are merely particular embodiments of the present disclosure but are not limitative to the scope of the present disclosure; any of those skilled familiar with the related arts may easily conceive variations and substitutions in the technical scopes disclosed by the present disclosure, which should be encompassed in protection scopes of the present disclosure. Therefore, the scopes of the present disclosure should be defined in the appended claims.

What is claimed is:

1. A frequency divider, comprising a duty cycle correction circuit and a frequency dividing circuit, wherein
the duty cycle correction circuit is configured to receive a first clock signal, and perform a first processing on the first clock signal to generate a first processed signal, wherein a period of the first clock signal is a first period, a period of the first processed signal is a second period, and the second period is one P-th of the first period, wherein P is an integer greater than 1,
the frequency dividing circuit is configured to receive the first processed signal, and perform a second processing on the first processed signal to generate a second processed signal, wherein a period of the second processed signal is a third period, and the third period is Q times the second period, wherein Q is an integer greater than 1, and
the duty cycle correction circuit is further configured to receive the second processed signal, and perform a third processing on the second processed signal to generate a third processed signal, wherein a period of the third processed signal is a fourth period, and the fourth period is P times the third period,
wherein the duty cycle correction circuit comprises a frequency multiplying sub-circuit, and the frequency multiplying sub-circuit is configured to perform the first processing on the first clock signal to obtain the first processed signal,
wherein the frequency multiplying sub-circuit comprises an XOR sub-circuit and a delay sub-circuit,
the delay sub-circuit receives the first clock signal, and performs a delay processing on the first clock signal to obtain a first delay signal, and
the XOR sub-circuit receives the first clock signal and the first delay signal, and performs an XOR operation on the first clock signal and the first delay signal to obtain the first processed signal.

2. The frequency divider according to claim 1, wherein the third processed signal is a clock signal with a duty cycle of 50%.

3. The frequency divider according to claim 1, wherein P=2.

4. The frequency divider according to claim 1, wherein the duty cycle correction circuit is connected to a first clock signal terminal to receive the first clock signal, and output the third processed signal.

5. The frequency divider according to claim 2, wherein the duty cycle correction circuit is connected to a first clock signal terminal to receive the first clock signal, and output the third processed signal.

6. The frequency divider according to claim 3, wherein the duty cycle correction circuit is connected to a first clock signal terminal to receive the first clock signal, and output the third processed signal.

7. The frequency divider according to claim 4, wherein the duty cycle correction circuit further comprises a frequency dividing sub-circuit,
the frequency dividing sub-circuit is configured to perform the third processing on the second processed signal to obtain the third processed signal.

8. The frequency divider according to claim 7, wherein the frequency dividing sub-circuit comprises a trigger sub-circuit,
a control terminal of the trigger sub-circuit is connected to the frequency dividing circuit to receive the second processed signal, and an output terminal of the trigger sub-circuit outputs the third processed signal.

9. The frequency divider according to claim 8, wherein the trigger sub-circuit is an edge-triggered D flip-flop,
a clock terminal of the edge-triggered D flip-flop is used as the control terminal to receive the second processed signal, an input terminal D of the edge-triggered D flip-flop is connected to a second output terminal QB of the edge-triggered D flip-flop, and a first output terminal Q of the edge-triggered D flip-flop outputs the third processed signal.

10. The frequency divider according to claim 1, wherein the frequency dividing circuit is a multi-mode frequency divider.

11. The frequency divider according to claim 2, wherein the frequency dividing circuit is a multi-mode frequency divider.

12. The frequency divider according to claim 3, wherein the frequency dividing circuit is a multi-mode frequency divider.

13. An electronic device, comprising a frequency divider, wherein the frequency divider comprises a duty cycle correction circuit and a frequency dividing circuit, wherein
the duty cycle correction circuit is configured to receive a first clock signal, and perform a first processing on the first clock signal to generate a first processed signal, wherein a period of the first clock signal is a first period, a period of the first processed signal is a second period, and the second period is one P-th of the first period, wherein P is an integer greater than 1, the frequency dividing circuit is configured to receive the first processed signal, and perform a second processing on the first processed signal to generate a second processed signal, wherein a period of the second processed signal is a third period, and the third period is Q times the second period, wherein Q is an integer greater than 1, and the duty cycle correction circuit is further configured to receive the second processed signal, and perform a third processing on the second processed signal to generate a third processed signal, wherein a period of the third processed signal is a fourth period, and the fourth period is P times the third period, wherein the duty cycle correction circuit comprises a frequency multiplying sub-circuit, and the frequency multiplying sub-circuit is configured to perform the first processing on the first clock signal to obtain the first processed signal, wherein the frequency multiplying sub-circuit comprises an XOR sub-circuit and a delay sub-circuit, the delay sub-circuit receives the first clock signal, and performs a delay processing on the first clock signal to obtain a first delay signal, and the XOR sub-circuit receives the first clock signal and the first delay signal, and performs an XOR operation on the first clock signal and the first delay signal to obtain the first processed signal.

14. A frequency dividing method, comprising:

performing a first processing on a first clock signal to generate a first processed signal, wherein a period of the first clock signal is a first period, a period of the first processed signal is a second period, and the second period is one P-th of the first period, wherein P is an integer greater than 1;

performing a second processing on the first processed signal to generate a second processed signal, wherein a period of the second processed signal is a third period, and the third period is Q times the second period, wherein Q is an integer greater than 1; and performing a third processing on the second processed signal to generate a third processed signal, wherein a period of the third processed signal is a fourth period, and the fourth period is P times the third period, wherein performing the first processing on the first clock signal to generate the first processed signal comprises:
  performing a delay processing on the first clock signal to obtain a first delay signal; and
  performing an XOR operation on the first clock signal and the first delay signal to obtain the first processed signal.

15. The frequency dividing method according to claim 14, wherein the third processed signal is a clock signal with a duty cycle of 50%.

16. The frequency dividing method according to claim 14, wherein P=2.

17. The frequency dividing method according to claim 16, wherein performing the third processing on the second processed signal to generate the third processed signal comprises:
  performing the third processing by using an edge-triggered D flip-flop to generate the third processed signal.

* * * * *